US010224886B2

(12) United States Patent
Lu et al.

(10) Patent No.: US 10,224,886 B2
(45) Date of Patent: Mar. 5, 2019

(54) OPERATIONAL AMPLIFIER CIRCUIT USING VARIABLE BIAS CONTROL

(71) Applicant: NOVATEK MICROELECTRONICS CORP., HsinChu (TW)

(72) Inventors: Chih-Wen Lu, Hsinchu (TW); Po-Yu Tseng, Zhongli (TW); Jhih-Siou Cheng, New Taipei (TW); Shang-I Liu, Xaohsiung (TW); Chih-Hsien Chou, Hsinchu (TW)

(73) Assignee: NOVATEK MICROELECTRONICS CORP., Hsinchu (TW)

( * ) Notice: Subject to any disclaimer, the term of this patent is extended or adjusted under 35 U.S.C. 154(b) by 0 days.

(21) Appl. No.: 15/716,789

(22) Filed: Sep. 27, 2017

(65) Prior Publication Data
US 2018/0337646 A1    Nov. 22, 2018

Related U.S. Application Data

(60) Provisional application No. 62/508,457, filed on May 19, 2017.

(51) Int. Cl.
*H03F 3/45* (2006.01)
*G05F 1/56* (2006.01)
(Continued)

(52) U.S. Cl.
CPC ........... *H03F 3/45183* (2013.01); *G05F 1/56* (2013.01); *H03F 1/3211* (2013.01); *H03F 3/3027* (2013.01); *H03F 3/45632* (2013.01)

(58) Field of Classification Search
CPC .... H03F 3/45; H03F 3/45179; H03F 3/45183; H03F 3/45188; H03F 3/45192; H03F 2200/177
(Continued)

(56) References Cited

U.S. PATENT DOCUMENTS 6,215,339 B1    4/2001  Hedberg
7,078,969 B2    7/2006  Bhattacharjee et al.
(Continued)

OTHER PUBLICATIONS

TIPO Office Action dated Oct. 16, 2018 in Taiwan application (No. 107108231).
(Continued)

*Primary Examiner* — Khanh V Nguyen
(74) *Attorney, Agent, or Firm* — McClure, Qualey & Rodack, LLP

(57) ABSTRACT

An operational amplifier circuit is provided. The operational amplifier circuit includes a differential input stage circuit and a loading stage circuit. The differential input stage circuit includes a first current source, a first transistor, a second transistor, a third transistor, and a fourth transistor. The control terminal of the first transistor receives a first input signal. The control terminal of the second transistor receives a second input signal. The third transistor has a first terminal coupled to the second terminal of the first transistor, a second terminal coupled to the first current source, and a control terminal coupled to the control terminal of the second transistor. The fourth transistor has a first terminal coupled to the second terminal of the second transistor, a second terminal coupled to the first current source, and a control terminal coupled to the control terminal of the first transistor.

18 Claims, 7 Drawing Sheets

(51) Int. Cl.
*H03F 1/32* (2006.01)
*H03F 3/30* (2006.01)

(58) Field of Classification Search
USPC .......................................... 330/253
See application file for complete search history.

(56) References Cited

U.S. PATENT DOCUMENTS

| 8,384,465 B2 | 2/2013 | Zanchi | |
|---|---|---|---|
| 2003/0095003 A1 | 5/2003 | Li et al. | |
| 2007/0247227 A1* | 10/2007 | Zhang | H03F 1/083 |
| | | | 330/253 |
| 2008/0106335 A1* | 5/2008 | Kimura | H03F 1/3211 |
| | | | 330/253 |
| 2008/0309408 A1* | 12/2008 | Lih | H03F 3/45183 |
| | | | 330/253 |

OTHER PUBLICATIONS

Non-Final Office Action issued in U.S. Appl. No. 15/802,617, filed Nov. 3, 2017, dated Sep. 19, 2018.

* cited by examiner

OPERATIONAL AMPLIFIER CIRCUIT USING VARIABLE BIAS CONTROL

This application claims the benefit of U.S. provisional application Ser. No. 62/508,457, filed May 19, 2017, the subject matter of which is incorporated herein by reference.

TECHNICAL FIELD

The disclosure relates in general to an operational amplifier circuit, and more particularly to an operational amplifier circuit using a variable bias control differential pair.

BACKGROUND

An operational amplifier circuit has a variety of applications in modern electronic devices. For example, the operational amplifier circuit may be used in a driver circuit for driving a display panel, such as a liquid crystal display (LCD) panel. It is common for an operational amplifier to adopt a differential pair as an input stage for receiving input signals. The linear range of the differential pair is affected by the input voltage difference of the differential pair. For example, the relation between the input voltage difference and the output current (such as the drain current in a MOSFET implemented differential pair) is linear when the input voltage difference is small. However, the relation becomes nonlinear when the input voltage difference is too large. In order to increase the linear range, a known approach is to provide larger bias current for the differential pair, which in turn results in larger power consumption.

The linear range of a differential pair is especially important for the operational amplifier circuit in a LCD driver circuit. When the input voltage difference of the differential pair exceeds the linear range, the output voltage may deviate from the desired value, and hence the image quality provided by the LCD panel is degraded. Therefore, it is an important subject in the industry to design an operational amplifier circuit with extended linear range.

FIG. 1 shows a block diagram of an example operational amplifier (OP). The operational amplifier circuit 10 includes a differential input stage circuit 101, a loading stage circuit 102, and an output stage circuit 103. The differential input stage circuit 101 receives the first input signal Vin1 and the second input signal Vin2. The differential input stage circuit 101 may be configured to amplify a voltage difference between the first input signal Vin1 and the second input signal Vin2. The loading stage circuit 102 may be configured to convert differential currents outputted by the differential input stage circuit 101 to an output signal VO. The loading stage circuit 102 may include an active load circuit (such as transistors) and/or a passive load circuit (such as resistors, capacitors, and inductors). The active load circuit may also be referred as the gain stage circuit.

The combination of the differential input stage circuit 101 and the loading stage circuit 102 may be referred as the 1$^{st}$ stage OP 11. The output stage circuit 103 may be referred as the 2$^{nd}$ stage OP 12. The voltage gain $A_v$ of the operational amplifier circuit 10 is the product of the voltage gain $A_{v1}$ of the 1$^{st}$ stage OP 11 and the voltage gain $A_{v2}$ of the 2$^{nd}$ stage OP 12 ($A_v = A_{v1} \times A_{v2}$). The voltage gain $A_{v1}$ of the 1$^{st}$ stage OP is the transconductance Gm of the differential input stage circuit 101 multiplied by the output resistance $r_o$ of the loading stage circuit 102 ($A_{v1} = Gm \times r_o$).

FIG. 2 shows a circuit diagram of an example differential input stage circuit. In this example the differential input stage circuit 101 of the operational amplifier circuit 11a includes a differential pair formed by two n-type metaloxidesemiconductor field-effect transistor (NMOS) transistors M01 and M02 and a current source $I_{O1}$. The two NMOS transistor M01 and M02 have equal gate width and equal gate length. The current value provided by the current source $I_{O1}$ is I. The transistor M01 receives the first input signal $V_{in1}$, and the transistor M02 receives the second input signal $V_{in2}$. The transistors M01 and M02 in the differential input stage circuit 101 operate in the saturation region. The drain currents $i_1$ and $i_2$ of these two transistors M01 and M02 may be represented by the following equations:

$$i_1 = \frac{I}{2} + \sqrt{\mu_n C_{ox} \frac{W}{L} I} \left(\frac{v_{id}}{2}\right) \sqrt{1 - \frac{(v_{id}/2)^2}{I/\mu_n C_{ox} \frac{W}{L}}} \quad \text{(Eq. 1A)}$$

$$i_2 = \frac{I}{2} - \sqrt{\mu_n C_{ox} \frac{W}{L} I} \left(\frac{v_{id}}{2}\right) \sqrt{1 - \frac{(v_{id}/2)^2}{I/\mu_n C_{ox} \frac{W}{L}}} \quad \text{(Eq. 1B)}$$

where $\mu_n$ is the charge-carrier effective mobility, W is the gate width of the NMOS transistor M01, L is the gate length of the NMOS transistor M01, $C_{ox}$ is the gate oxide capacitance per unit area, and $v_{id}$ is the input voltage difference, $v_{id} = V_{in1} - V_{in2}$. Based on Eq. 1A and Eq. 1B, when $$\frac{v_{id}}{2} \ll \sqrt{\frac{I}{\mu_n C_{ox} \frac{W}{L}}}, \quad \text{(Eq. 2)}$$

the drain currents $I_1$ and $I_2$ may be approximately represented as a linear relation as follows:

$$i_1 = \frac{I}{2} + \sqrt{\mu_n C_{ox} \frac{W}{L} I} \left(\frac{v_{id}}{2}\right) \quad \text{(Eq. 3A)}$$

$$i_2 = \frac{I}{2} - \sqrt{\mu_n C_{ox} \frac{W}{L} I} \left(\frac{v_{id}}{2}\right) \quad \text{(Eq. 3B)}$$

That is, when the condition in Eq. 2 is satisfied, the relation between the drain current and the input voltage difference $v_{id}$ is linear. The transconductance Gm of the differential pair shown in FIG. 2 is:

$$G_m = \frac{i_1}{v_{id}/2} = \sqrt{\mu_n C_{ox} \frac{W}{L} I} \quad \text{(Eq. 4)}$$

FIG. 3 shows a diagram illustrating a transconductance of the differential input stage circuit shown in FIG. 2. The horizontal axis is the input voltage difference $v_{id}$. The transconductance Gm is relatively stable when the input voltage difference $v_{id}$ is small, and hence there is a linear transfer relation between the drain current and the input voltage difference $v_{id}$. When the input voltage difference $v_{id}$ becomes larger, the transconductance Gm decreases, and the transfer relation becomes nonlinear. When the input voltage difference $v_{id}$ exceeds $+\Delta V1$ (or less than $-\Delta V1$), the transconductance Gm becomes 0, and hence the differential pair does not work properly under such input voltage condition.

SUMMARY

The disclosure is directed to an operational amplifier circuit using a variable bias control differential pair that can achieve a larger linear range.

According to one embodiment of the invention, an operational amplifier circuit is provided. The operational amplifier circuit includes a differential input stage circuit and a loading stage circuit. The differential input stage circuit includes a first current source, a first transistor, a second transistor, a third transistor, and a fourth transistor. The control terminal of the first transistor receives a first input signal. The control terminal of the second transistor receives a second input signal. The third transistor has a first terminal coupled to the second terminal of the first transistor, a second terminal coupled to the first current source, and a control terminal coupled to the control terminal of the second transistor. The fourth transistor has a first terminal coupled to the second terminal of the second transistor, a second terminal coupled to the first current source, and a control terminal coupled to the control terminal of the first transistor. The loading stage circuit is coupled to the first terminal of the first transistor and the first terminal of the second transistor, for generating an output signal at an output terminal of the operational amplifier circuit.

The invention will become apparent from the following detailed description of the preferred but non-limiting embodiments. The following description is made with reference to the accompanying drawings.

Figure 1:
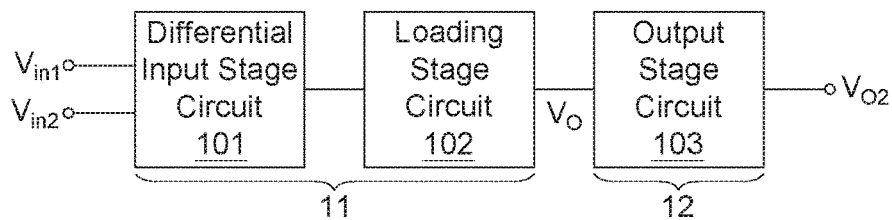
FIG. 1 (prior art) shows a block diagram of an example operational amplifier.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DETAILED DESCRIPTION

Refer to the example shown in FIG. 1, the second output signal $V_{O2}$ provided by the output stage circuit 103 is a single-ended voltage signal. If the operational amplifier circuit 10 is used in a display device, the output stage circuit 103 may provide a driving voltage for a display panel. The operational amplifier circuit 10 includes two stages of OP, the $1^{st}$ stage OP 11 and the $2^{nd}$ stage OP 12, in the example shown in FIG. 1. In other embodiments, there may be only one stage OP or more than two stages of OP in the operational amplifier circuit. Because the $2^{nd}$ stage OP (as well as other $3^{rd}$, $4^{th}$ . . . stage OP) may be optionally removed, the main focus in the following description will be on the $1^{st}$ stage OP 11, including the differential input stage circuit 101 and the loading stage circuit 102.

Figure 4:
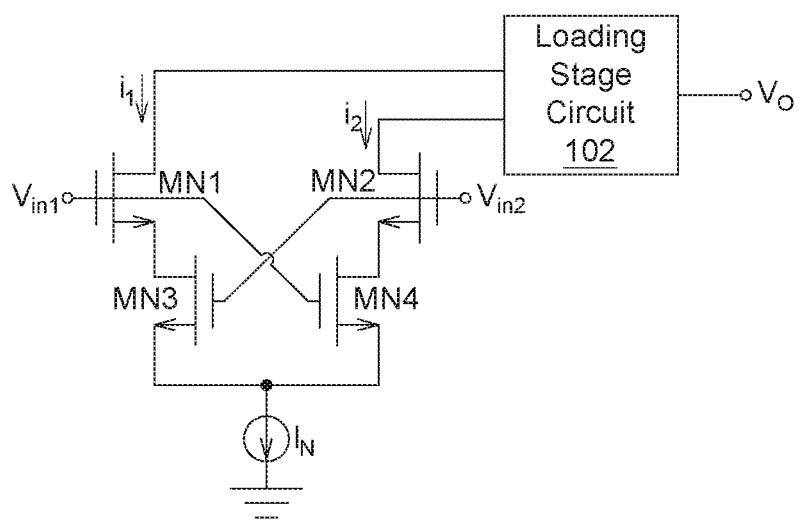
FIG. 4 shows an operational amplifier circuit according to one embodiment of the invention.

FIG. 4 shows an operational amplifier circuit according to one embodiment of the invention. The operational amplifier circuit 11b includes a differential input stage circuit 101 and a loading stage circuit 102. The differential input stage circuit 101 includes a first current source $I_N$, a first transistor MN1, a second transistor MN2, a third transistor MN3, and a fourth transistor MN4. The control terminal of the first transistor MN1 receives a first input signal $V_{in1}$. The control terminal of the second transistor MN2 receives a second input signal $V_{in2}$. The third transistor MN3 has a first terminal coupled to the second terminal of the first transistor MN1, a second terminal coupled to the first current source $I_N$, and a control terminal coupled to the control terminal of the second transistor MN2. The fourth transistor MN4 has a first terminal coupled to the second terminal of the second transistor MN2, a second terminal coupled to the first current source $I_N$, and a control terminal coupled to the control terminal of the first transistor MN1. The loading stage circuit 102 is coupled to the first terminal of the first transistor MN1 and the first terminal of the second transistor MN2, for generating an output signal $V_O$ at an output terminal of the operational amplifier circuit 11b.

The operational amplifier circuit 11b may be used in a display device. For example, the output terminal of the operational amplifier circuit 11b may be coupled to an output stage circuit 103. The output stage circuit 103 may include power MOSFETs to provide sufficient driving capability. In one embodiment, the output stage circuit 103 is configured to provide a single-ended voltage signal for driving a display panel.

In the example shown in FIG. 4, the first transistor MN1, the second transistor MN2, the third transistor MN3, and the fourth transistor MN4 are NMOS transistors. The first terminal, the second terminal, and the control terminal of an NMOS transistor may correspond to the drain terminal, the source terminal, and the gate terminal, respectively.

In one embodiment, the size (gate width W and gate length L) of the first transistor MN1 is substantially equal to the size of the second transistor MN2 (represented as $\left(\frac{W}{L}\right)_1$ in the following formulas). The size of the third transistor MN3 is substantially equal to the size of the fourth transistor MN4 (represented as $\left(\frac{W}{L}\right)_3$ in the following formulas).

As can be seen in FIG. 4, the bias voltage of the third transistor MN3 is a variable voltage. Similarly, the bias voltage of the fourth transistor MN4 is also a variable voltage. The differential pair shown in FIG. 4 uses a variable bias control mechanism. In this circuit, the first transistor MN1 and the second transistor MN2 operate in the saturation region. The third transistor MN3 and the fourth transistor MN4 operate in the triode region, acting as variable resistors. The third transistor MN3 and the fourth transistor MN4 are degeneration devices for the first transistor MN1 and the second transistor MN2 respectively. The third transistor MN3 and the fourth transistor MN4 constitute a feedback loop at the second terminal (source terminal) of the first transistor MN1 and the second transistor MN2, effectively extending the linear range of the operational amplifier circuit 11b.

Refer to FIG. 4, when the input voltage difference $v_{id}$ ($v_{id}=V_{in1}-V_{in2}$) is small, the third transistor MN3 and the fourth transistor MN4 operate in the triode region. Taking the third transistor MN3 for example, the resistance value between its drain terminal and its source terminal is controlled by the second input signal V. Similarly, the resistance value between the drain terminal and the source terminal of the fourth transistor MN4 is controlled by the first input signal $V_{in1}$. Consider the situation when the voltage of the first input signal $V_{in1}$ increases and the voltage of the second input signal $V_{in2}$ decreases, the drain current $i_1$ will increase, and the drain current $i_2$ will decrease. Because the resistance value between the drain terminal and the source terminal of the third transistor MN3 increases (caused by decreased $V_{in2}$), the increased drain current $i_t$ will increase the voltage across the drain terminal and the source terminal of the third transistor MN3. Because of such negative feedback, the increment (the amount that the voltage increases) of the gate-to-source voltage of the first transistor MN1 will be smaller than the increment of the first input signal $V_{in1}$. Therefore, the increment of the drain current $i_1$ decreases. On the other hand, the resistance value between the drain terminal and the source terminal of the fourth transistor MN4 decreases (caused by increased $V_{in1}$), the decreased drain current $i_2$ will decrease the voltage across the drain terminal and the source terminal of the fourth transistor MN4. The decrement of the gate-to-source voltage of the second transistor MN2 will be smaller than the decrement of the second input signal $V_{in2}$. Therefore, the drain current $i_2$ will not decrease rapidly. As described above, when the voltage of the first input signal $V_{in1}$ increases and the voltage of the second input signal $V_{in2}$ decreases, the change in the drain currents $i_1$ and $i_2$ can be kept small, resulting in an improved linear range for the differential pair. The detailed analysis for current and voltage of the circuit shown in FIG. 4 is provided below.

$i_1 = \frac{1}{2}k_1(V_{in1}-V_{S1}-V_{t1})^2$     Drain current $i_1$ (MN1):

$i_1 = k_3(V_{in2}-V_S-V_{t3})(V_{S1}-V_S)$     Drain current $i_1$ (MN3):

$i_2 = \frac{1}{2}k_2(V_{in2}-V_{S2}-V_{t2})^2$     Drain current $i_2$ (MN2):

$i_2 = k_4(V_{in1}-V_S-V_{t4})(V_{S2}-V_S)$     Drain current $i_2$ (MN4):

where $i_1+i_2=I$;

$$k_1 = k_2 = \mu_n C_{ox}\left(\frac{W}{L}\right)_1;$$

$$k_3 = k_4 = \mu_n C_{ox}\left(\frac{W}{L}\right)_3;$$

$V_{S1}$ and $V_{S2}$ are the source voltages of the first transistor MN1 and the second transistor MN2 respectively. When the input voltage difference $v_{id}$ is small, the third transistor MN3 and the fourth transistor MN4 operate in the triode region, and the source voltages of these four transistors MN1-MN4 are close. In addition, the threshold voltages of these four transistors MN1-MN4 are also close. In addition, $V_{t1}=V_{t2}=V_{t3}=V_{t4}=V_t$ may be substituted in the above equations. After formula manipulation and simplification, the drain currents may be expressed as:

$$i_1 \cong \frac{I}{2} + \sqrt{\mu_n C_{ox}(W/L)_1 I}\left[1 - \frac{3(W/L)_1}{2[(W/L)_1+(W/L)_3]}\right]\left(\frac{v_{id}}{2}\right) \times \sqrt{1 - \frac{\mu_n C_{ox}(W/L)_1}{I}\left[1 - \frac{3(W/L)_1}{2[(W/L)_1+(W/L)_3]}\right]^2 \left(\frac{v_{id}}{2}\right)^2} \quad \text{(Eq. 5A)}$$

$$i_2 \cong \frac{I}{2} - \sqrt{\mu_n C_{ox}(W/L)_1 I}\left[1 - \frac{3(W/L)_1}{2[(W/L)_1+(W/L)_3]}\right]\left(\frac{v_{id}}{2}\right) \times \sqrt{1 - \frac{\mu_n C_{ox}(W/L)_1}{I}\left[1 - \frac{3(W/L)_1}{2[(W/L)_1+(W/L)_3]}\right]^2 \left(\frac{v_{id}}{2}\right)^2} \quad \text{(Eq. 5B)}$$

Based on Eq. 5A and Eq. 5B, when $$\frac{v_{id}}{2} \ll \frac{\sqrt{I/\mu_n C_{ox}(W/L)_1}}{1 - \frac{3(W/L)_1}{2[(W/L)_1+(W/L)_3]}}, \quad \text{(Eq. 6)}$$

the drain currents $i_1$ and $i_2$ may be approximately represented as a linear relation as follows:

$$i_1 \cong \frac{I}{2} + \sqrt{\mu_n C_{ox}(W/L)_1 I}\left[1 - \frac{3(W/L)_1}{2[(W/L)_1+(W/L)_3]}\right]\left(\frac{v_{id}}{2}\right) \quad \text{(Eq. 7A)}$$

$$i_2 \cong \frac{I}{2} - \sqrt{\mu_n C_{ox}(W/L)_1 I}\left[1 - \frac{3(W/L)_1}{2[(W/L)_1+(W/L)_3]}\right]\left(\frac{v_{id}}{2}\right) \quad \text{(Eq. 7B)}$$

That is, when the condition in Eq. 6 is satisfied, the relation between the drain current and the input voltage difference $v_{id}$ is linear. The transconductance Gm of the differential pair shown in FIG. 4 is:

$$G_m = \frac{i_1}{v_{id}/2} = \sqrt{\mu_n C_{ox}(W/L)_1 I}\left[1 - \frac{3(W/L)_1}{2[(W/L)_1+(W/L)_3]}\right] \quad \text{(Eq. 8)}$$

Figure 2:
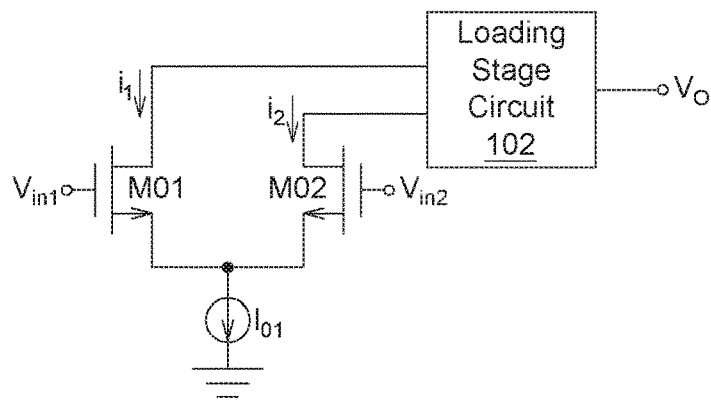
FIG. 2 (prior art) shows a circuit diagram of an example differential input stage circuit.

Compare Eq. 8 with Eq. 4, the transconductance Gm of the differential pair (four transistor architecture, 4T) as shown in FIG. 4 is $$\left[1 - \frac{3(W/L)_1}{2[(W/L)_1 + (W/L)_3]}\right]$$

times of the transconductance Gm of the differential pair (two transistor architecture, 2T) as shown in FIG. 2 (the transconductance Gm is reduced). However, compare Eq. 6 with Eq. 2, the linear range of the 4T differential pair is $$\frac{1}{\left[1 - \frac{3(W/L)_1}{2[(W/L)_1 + (W/L)_3]}\right]}$$

times of the linear range of the 2T differential pair. In other words, the proposed differential input stage circuit shown in FIG. 4 is able to extend the linear range for the input voltage difference. In addition, a desired linear range can be designed by appropriately adjusting the size of the four transistors MN1-MN4 (adjusting $\left(\frac{W}{L}\right)_1$ and $\left(\frac{W}{L}\right)_3$ ) based on the formula $$\frac{1}{\left[1 - \frac{3(W/L)_1}{2[(W/L)_1 + (W/L)_3]}\right]}.$$

Figure 3:
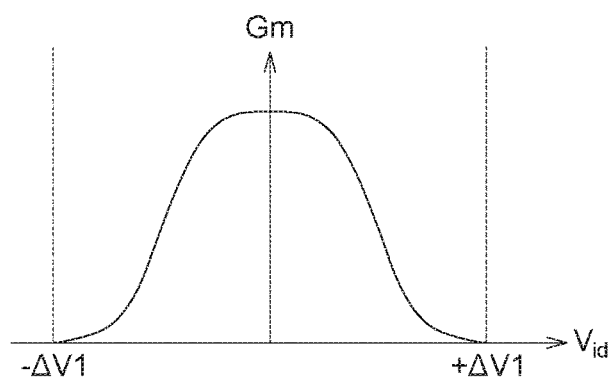
FIG. 3 (prior art) shows a diagram illustrating a transconductance of the differential input stage circuit shown in FIG. 2.
Figure 5:
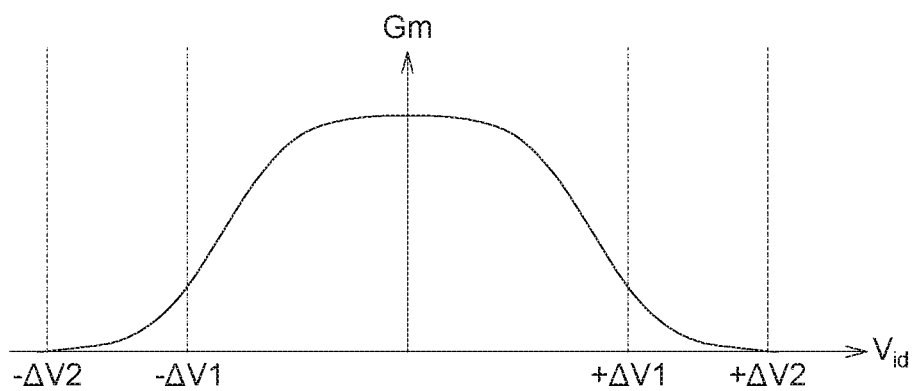
FIG. 5 shows a diagram illustrating a transconductance of the differential input stage circuit shown in FIG. 4.

FIG. 5 shows a diagram illustrating a transconductance of the differential input stage circuit shown in FIG. 4. The horizontal axis is the input voltage difference $v_{id}$. When the input voltage difference $v_{id}$ exceeds $+\Delta V2$ (or less than $-\Delta V2$), the transconductance Gm becomes 0, and hence the differential pair does not work properly under such input voltage condition. Compare FIG. 5 with FIG. 3, the input voltage range that results in a stable transconductance Gm is enlarged in FIG. 5. $\Delta V2 > \Delta V1$, and hence the linear range of the differential pair is greatly enhanced.

Figure 6:
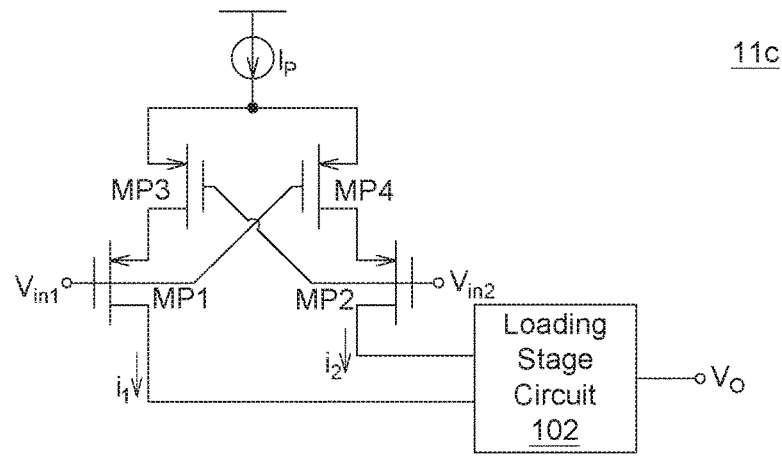
FIG. 6 shows an operational amplifier circuit including a PMOS differential pair according to one embodiment of the invention.

In the above embodiment NMOS transistors are used in the differential input stage circuit 101. In another embodiment, the differential input stage circuit 101 may include PMOS transistors instead. FIG. 6 shows an operational amplifier circuit 11c including a PMOS differential pair according to one embodiment of the invention. The connection topology and the operation are similar to those in FIG. 4 and thus are not repeated herein. In this embodiment, the transistors MP1-MP4 are PMOS transistors. The first terminal, the second terminal, and the control terminal of a PMOS transistor may correspond to the drain terminal, the source terminal, and the gate terminal, respectively.

In another embodiment, the MOSFET transistors may be replaced by bipolar junction transistors (BJT). For example, the transistors MN1-MN4 in FIG. 4 may be replaced by NPN-type BJTs. The transistors MP1-MP4 in FIG. 6 may be replaced by PNP-type BJTs. In still another embodiment, other types of transistors such as junction gate field-effect transistor (JFET) may be used instead, or different types of transistors may be used in combination in one differential pair.

Figure 7:
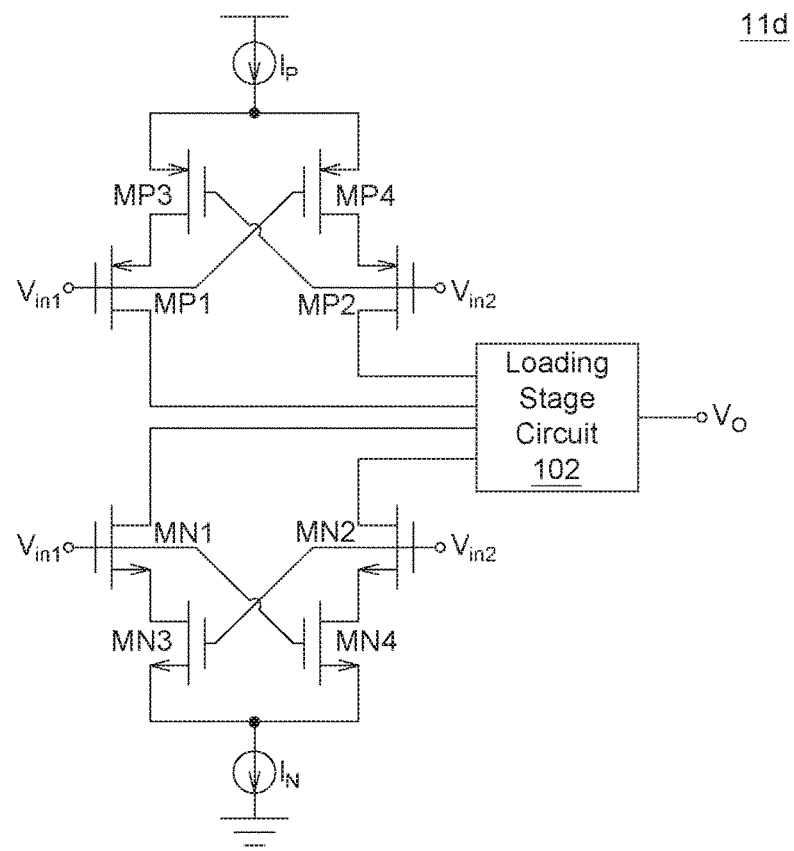
FIG. 7 shows a rail-to-rail operational amplifier circuit according to one embodiment of the invention.

FIG. 7 shows a rail-to-rail operational amplifier circuit 11d according to one embodiment of the invention. In addition to the transistors MN1-MN4 as shown in FIG. 4, the differential input stage circuit 101 in FIG. 7 also includes a first complementary current source $I_P$, a first complementary transistor MP1, a second complementary transistor MP2, a third complementary transistor MP3, and a fourth complementary transistor MP4. The first complementary transistor MP1 has a first terminal, a second terminal, and a control terminal for receiving the first input signal $V_{in1}$. The second complementary transistor MP2 has a first terminal, a second terminal, and a control terminal for receiving the second input signal $V_{in2}$. The third complementary transistor MP3 has a first terminal coupled to the second terminal of the first complementary transistor MP1, a second terminal coupled to the first complementary current source $I_P$, and a control terminal coupled to the control terminal of the second complementary transistor MP2. The fourth complementary transistor MP4 has a first terminal coupled to the second terminal of the second complementary transistor MP2, a second terminal coupled to the first complementary current source $I_P$, and a control terminal coupled to the control terminal of the first complementary transistor MP1. The loading stage circuit 102 is coupled to the first terminal of the first complementary transistor MP1 and the first terminal of the second complementary transistor MP2.

The gate terminal of the first transistor MN1 and the gate terminal of the first complementary transistor MP1 are coupled together. The gate terminal of the second transistor MN2 and the gate terminal of the second complementary transistor MP2 are also coupled together. The connection relationship between complementary transistors MP1-MP4 is similar to that shown in FIG. 6. The rail-to-rail operational amplifier circuit 11d is able to provide a wider dynamic range for input signals and output signals.

In one embodiment, the first transistor MN1, the second transistor MN2, the third transistor MN3, and the fourth transistor MN4 are NMOS transistors. The first complementary transistor MP1, the second complementary transistor MP2, the third complementary transistor MP3, and the fourth complementary transistor MP4 are PMOS transistors. As described above, in another embodiment, NMOS transistors may be replaced by NPN-type BJTs, and PMOS transistors may be replaced by PNP-type BJTs.

In one embodiment, the size of the first complementary transistor MP1 is substantially equal to the size of the second complementary transistor MP2. The size of the third complementary transistor MP3 is substantially equal to the size of the fourth complementary transistor MP4.

Figure 8:
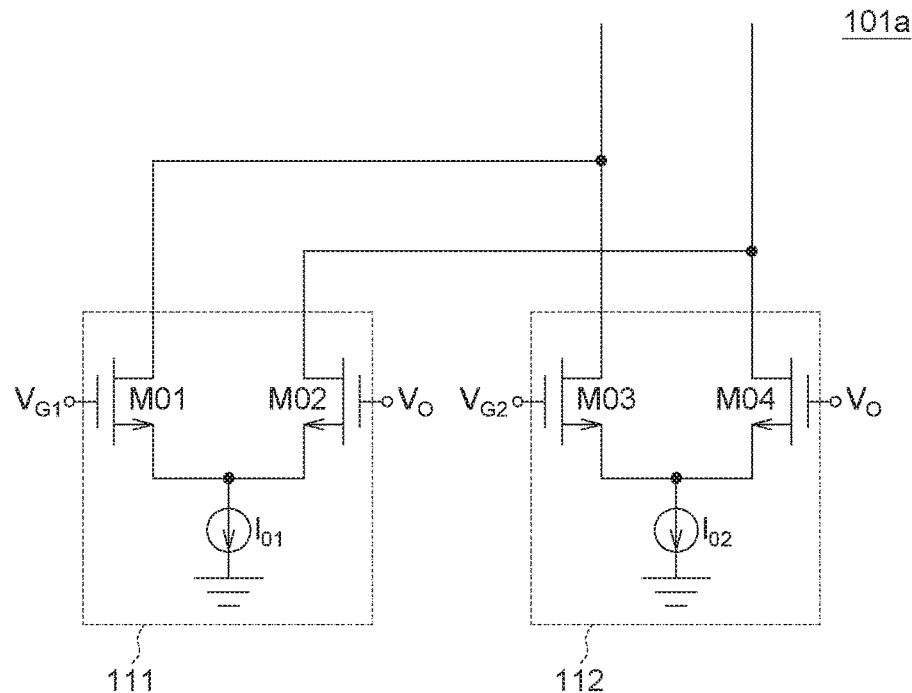
FIG. 8 shows a differential input stage circuit with voltage interpolation function according to one embodiment of the invention.

In LCD driver applications, an operational amplifier circuit may include multiple differential pairs to achieve voltage interpolation function. Such circuit design can reduce chip area and production cost. FIG. 8 shows a differential input stage circuit 101a with voltage interpolation function according to one embodiment of the invention. The loading stage circuit 102 is not illustrated in this figure for simplicity reason. The differential input stage circuit 101a includes a first differential pair 111 and a second differential pair 112. The differential input stage circuit 101a is utilized for interpolating input signals $V_{G1}$ and $V_{G2}$ to generate an output signal $V_O$ according to a superposition principle. The output terminal of the loading stage circuit 102 is fed back to the differential input stage circuit 101a in this example.

The transconductance of the first differential pair 111 is Gm1, and the transconductance of the second differential pair 112 is Gm2. By the superposition principle, the output signal $V_O$ may be expressed as:

$$V_O = \frac{Gm1 \times V_{G1} + Gm2 \times V_{G2}}{Gm1 + Gm2}$$

Figure 9:
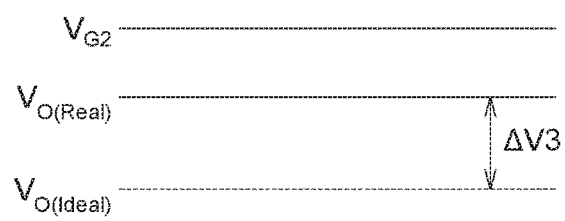
FIG. 9 shows the voltage levels of signals shown in FIG. 8.

Gm1=Gm2 in an ideal case ($V_O$=0.5×$V_{G1}$+0.5×$V_{G2}$). However, refer to FIG. 2 and FIG. 3, the linear range of the 2T differential pair is relatively small. Consequently, Gm1*Gm2 when the voltage difference between $V_{G1}$ and $V_{G2}$ is large. Therefore the real output voltage deviates from the ideal value. FIG. 9 shows the voltage levels of signals shown in FIG. 8. There is an error ΔV3 between the ideal output and the real output voltage.

Figures 10, 11:
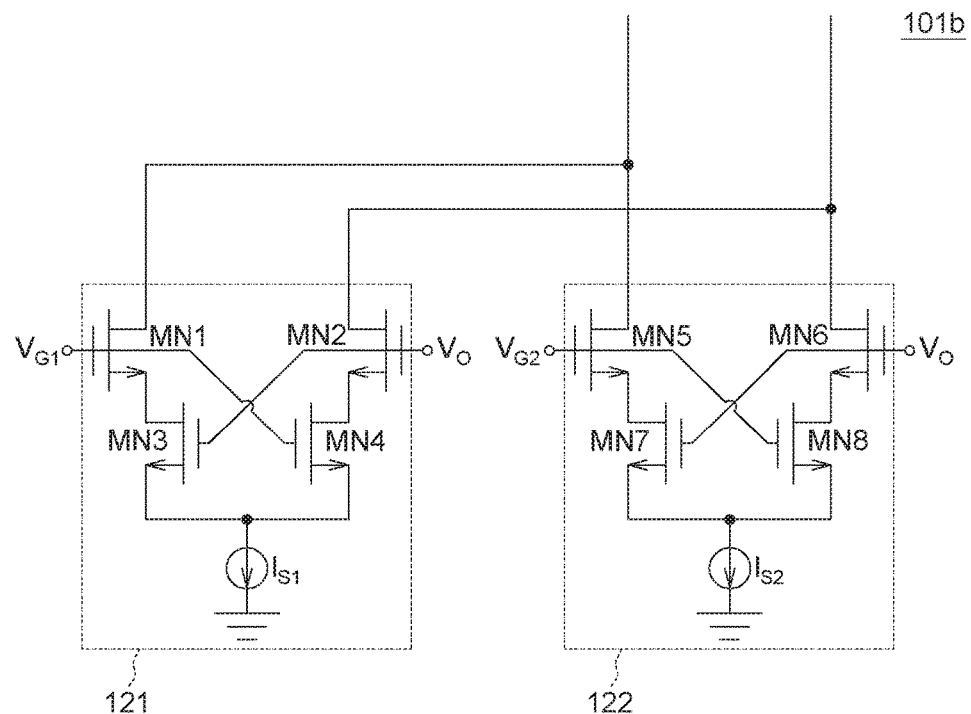
FIG. 10 shows a differential input stage circuit with voltage interpolation function according to one embodiment of the invention.
FIG. 11 shows the voltage levels of signals shown in FIG. 10.

FIG. 10 shows a differential input stage circuit 101b with voltage interpolation function according to one embodiment of the invention. In addition to the first differential pair 121, which includes the first current source $I_{S1}$ and the transistors MN1-MN4 as shown in FIG. 4, the differential input stage circuit 101b in FIG. 10 also includes the second differential pair 122. The second differential pair 122 includes a second current source $I_{S2}$, a fifth transistor MN5, a sixth transistor MN6, a seventh transistor MN7, and an eighth transistor MN8. The fifth transistor MN5 has a first terminal coupled to the first terminal of the first transistor MN1, a second terminal, and a control terminal for receiving a third input signal $V_{G2}$. The sixth transistor MN6 has a first terminal coupled to the first terminal of the second transistor MN2, a second terminal, and a control terminal for receiving a fourth input signal. The seventh transistor MN7 has a first terminal coupled to the second terminal of the fifth transistor MN5, a second terminal coupled to the second current source $I_{S2}$, and a control terminal coupled to the control terminal of the sixth transistor MN6. The eighth transistor MN8 has a first terminal coupled to the second terminal of the sixth transistor MN6, a second terminal coupled to the second current source $I_{S2}$, and a control terminal coupled to the control terminal of the fifth transistor MN5.

The control terminal of the second transistor MN2 and the control terminal of the sixth transistor MN6 may be coupled together (the second input signal being the same as the fourth input signal) to accomplish the voltage interpolation function. In one embodiment, the output terminal of the operational amplifier circuit is coupled to the control terminal of the second transistor MN2 and the control terminal of the sixth transistor MN6 (as shown in FIG. 10, receiving the output signal $V_O$). The output signal $V_O$ is an interpolation result of the first input signal $V_{G1}$ and the third input signal $V_{G2}$. The interpolation formula has been shown in the example of FIG. 8.

In one embodiment, the fifth to eighth transistors MN5-MN8 are NMOS transistors, which are of the same type as the first to fourth transistors MN1-MN4. In one embodiment, the size of the fifth transistor MN5 is substantially equal to the size of the sixth transistor MN6. The size of the seventh transistor MN7 is substantially equal to the size of the eighth transistor MN8.

Because 4T differential pairs are used in the example in FIG. 10, the linear range for input voltage difference is extended. As a result, the difference between the transconductance Gm1 of the first differential pair 121 and the transconductance Gm2 of the second differential pair 122 becomes smaller. The real output voltage will be closer to the ideal output voltage. FIG. 11 shows the voltage levels of signals shown in FIG. 10. There is an error ΔV4 between the ideal output and the real output voltage. As compared to FIG. 9, ΔV4<ΔV3. The extended linear range for the differential pair improves the accuracy of the voltage interpolation result.

Figure 12:
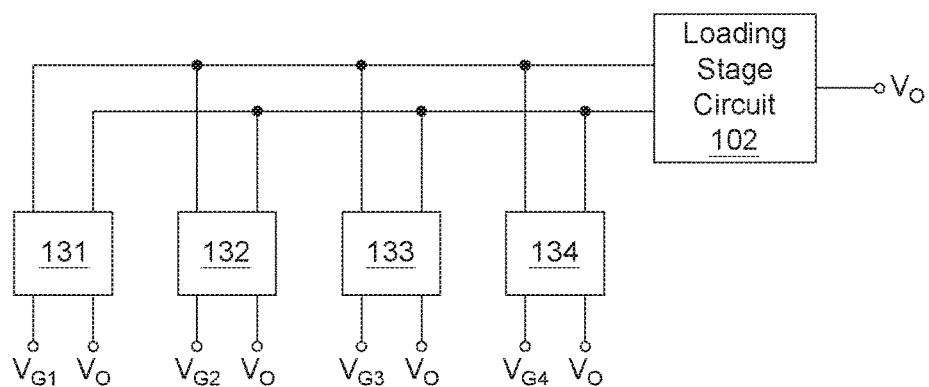
FIG. 12 shows an operational amplifier circuit including multiple differential pairs according to one embodiment of the invention.

Two differential pairs are illustrated in the examples shown in FIG. 8 and FIG. 10. In one embodiment, more differential pairs may be accommodated. FIG. 12 shows an operational amplifier circuit 11e including multiple differential pairs according to one embodiment of the invention. In this example, the differential input stage circuit 101 includes four differential pairs 131-134. Note that the number of total differential pairs may be other numbers, four differential pairs illustrated in this example is just exemplary rather than limiting. The first differential pair 131 receives an input signal $V_{G1}$ and the output signal $V_O$ fed back from the loading stage circuit 102. Similarly, the second differential pair 132 receives another input signal $V_{G2}$ and the output signal $V_O$. The output signal $V_O$ is an interpolation result of the input signals $V_{G1}$-$V_{G4}$. By adopting 4T architecture in the differential pairs 131-134, the extended linear range helps to reduce the output error of the operational amplifier circuit 11e.

Figure 13:
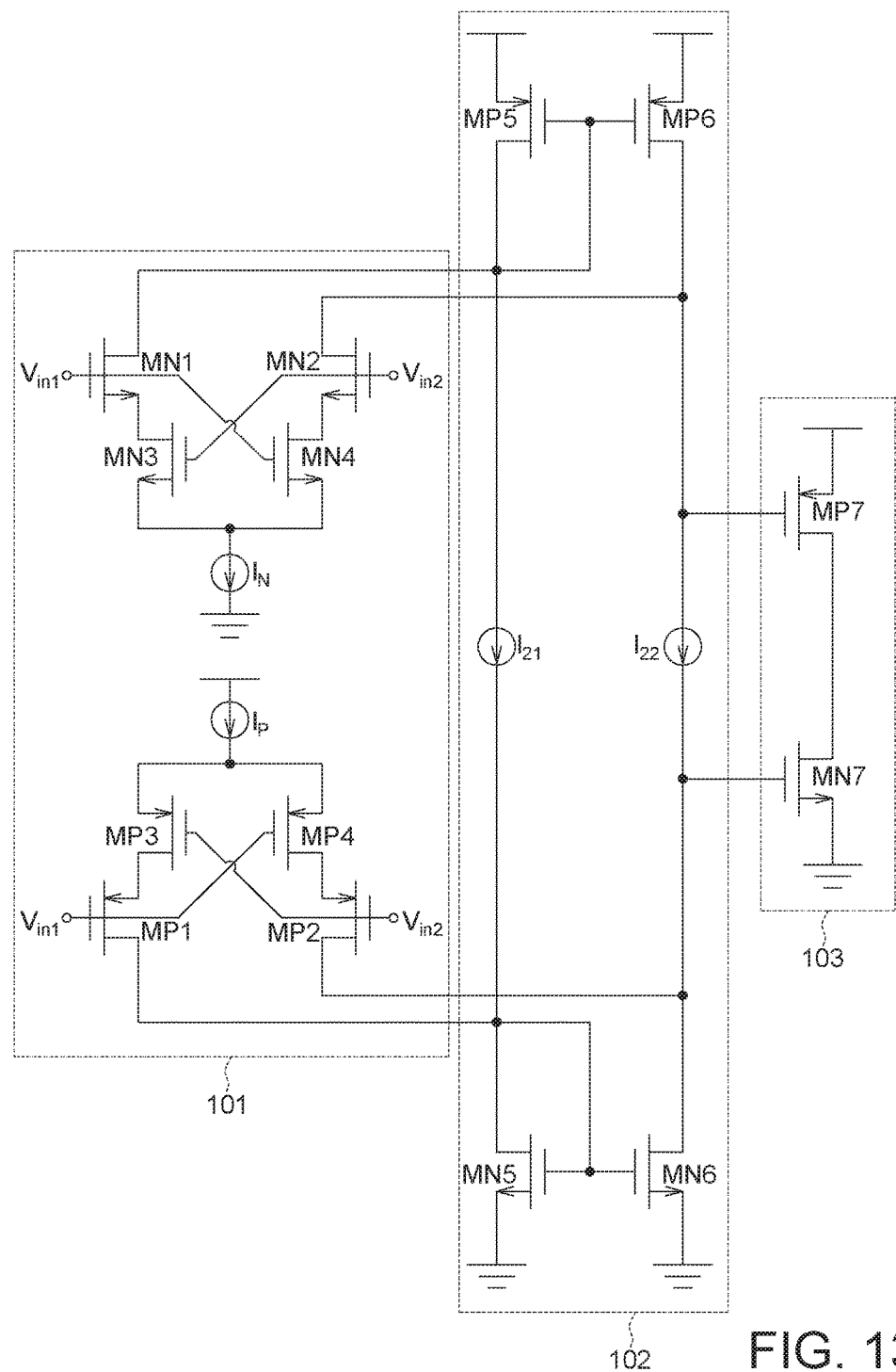
FIG. 13 shows an example circuit diagram regarding the loading stage circuit and the output stage circuit according to one embodiment of the invention.

As for the circuit implementation for the loading stage circuit 102 and the output stage circuit 103 shown in FIG. 1, FIG. 13 shows an example circuit diagram regarding the loading stage circuit and the output stage circuit according to one embodiment of the invention. In this embodiment the differential input stage circuit 101 adopts the rail-to-rail architecture shown in FIG. 7 as an example. The loading stage circuit 102 in this example includes the NMOS transistors MN5, MN6 and PMOS transistors MP5, MP6. The output stage circuit 103 in this example includes the NMOS transistor MN7 and PMOS transistor MP7. FIG. 13 shows merely an exemplary implementation. The circuit architecture for different applications may be modified correspondingly based on the design constraints, such as the voltage gain and bandwidth requirements.

According to the embodiments given above, an operational amplifier circuit using a variable bias control differential pair is provided. The differential pair circuit structure includes four transistors (4T). The operational amplifier circuit can effectively extend the linear range for the input voltage difference. The extended linear range can be designed to a desired value by appropriately adjusting the transistor size. In addition, the operational amplifier circuit can include multiple 4T differential pairs to achieve voltage interpolation function.

In LCD driver applications, the operational amplifier circuit is often preceded by a digital-to-analog converter (DAC). The proposed operational amplifier circuit adopts 4T structure to allow a larger range for the input voltage difference. Therefore the resolution requirement for the preceding DAC can be relaxed. In other words, the hardware cost for the DAC circuit can be effectively reduced because of the extended linear range of the proposed operational amplifier circuit.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:
1. An operational amplifier circuit, comprising:
 a differential input stage circuit, comprising:
  a first current source;
  a first transistor, having a first terminal, a second terminal, and a control terminal for receiving a first input signal;

a second transistor, having a first terminal, a second terminal, and a control terminal for receiving a second input signal;
a third transistor, having a first terminal coupled to the second terminal of the first transistor, a second terminal coupled to the first current source, and a control terminal coupled to the control terminal of the second transistor;
a fourth transistor, having a first terminal coupled to the second terminal of the second transistor, a second terminal coupled to the first current source, and a control terminal coupled to the control terminal of the first transistor;
a first complementary current source;
a first complementary transistor, having a first terminal, a second terminal, and a control terminal for receiving the first input signal;
a second complementary transistor, having a first terminal, a second terminal, and a control terminal for receiving the second input signal;
a third complementary transistor, having a first terminal coupled to the second terminal of the first complementary transistor, a second terminal coupled to the first complementary current source, and a control terminal coupled to the control terminal of the second complementary transistor;
a fourth complementary transistor, having a first terminal coupled to the second terminal of the second complementary transistor, a second terminal coupled to the first complementary current source, and a control terminal coupled to the control terminal of the first complementary transistor; and
a loading stage circuit, coupled to the first terminal of the first transistor, the first terminal of the second transistor, the first terminal of the first complementary transistor and the first terminal of the second complementary transistor, for generating an output signal at an output terminal of the operational amplifier circuit.

2. The operational amplifier circuit according to claim 1, wherein a size of the first transistor is substantially equal to a size of the second transistor, and a size of the third transistor is substantially equal to a size of the fourth transistor.

3. The operational amplifier circuit according to claim 1, wherein a size of the first complementary transistor is substantially equal to a size of the second complementary transistor, a size of the third complementary transistor is substantially equal to a size of the fourth complementary transistor.

4. The operational amplifier circuit according to claim 1, wherein the first transistor, the second transistor, the third transistor, and the fourth transistor are NMOS transistors, wherein the first complementary transistor, the second complementary transistor, the third complementary transistor, and the fourth complementary transistor are PMOS transistors.

5. The operational amplifier circuit according to claim 1, wherein the differential input stage circuit further comprises:
a second current source;
a fifth transistor, having a first terminal coupled to the first terminal of the first transistor, a second terminal, and a control terminal for receiving a third input signal;
a sixth transistor, having a first terminal coupled to the first terminal of the second transistor, a second terminal, and a control terminal for receiving a fourth input signal;
a seventh transistor, having a first terminal coupled to the second terminal of the fifth transistor, a second terminal coupled to the second current source, and a control terminal coupled to the control terminal of the sixth transistor; and
an eighth transistor, having a first terminal coupled to the second terminal of the sixth transistor, a second terminal coupled to the second current source, and a control terminal coupled to the control terminal of the fifth transistor.

6. The operational amplifier circuit according to claim 5, wherein the output terminal of the operational amplifier circuit is coupled to the control terminal of the second transistor and the control terminal of the sixth transistor.

7. The operational amplifier circuit according to claim 6, wherein the output signal is an interpolation result of the first input signal and the third input signal.

8. The operational amplifier circuit according to claim 5, wherein a size of the fifth transistor is substantially equal to a size of the sixth transistor, and a size of the seventh transistor is substantially equal to a size of the eighth transistor.

9. The operational amplifier circuit according to claim 1, wherein the output terminal of the operational amplifier circuit is coupled to an output stage circuit, and the output stage circuit is configured to provide a single-ended voltage signal for driving a display panel.

10. An operational amplifier circuit, comprising:
a differential input stage circuit, comprising:
a first current source;
a first transistor, having a first terminal, a second terminal, and a control terminal for receiving a first input signal;
a second transistor, having a first terminal, a second terminal, and a control terminal for receiving a second input signal;
a third transistor, having a first terminal coupled to the second terminal of the first transistor, a second terminal coupled to the first current source, and a control terminal coupled to the control terminal of the second transistor;
a fourth transistor, having a first terminal coupled to the second terminal of the second transistor, a second terminal coupled to the first current source, and a control terminal coupled to the control terminal of the first transistor;
a second current source;
a fifth transistor, having a first terminal coupled to the first terminal of the first transistor, a second terminal, and a control terminal for receiving a third input signal;
a sixth transistor, having a first terminal coupled to the first terminal of the second transistor, a second terminal, and a control terminal for receiving a fourth input signal;
a seventh transistor, having a first terminal coupled to the second terminal of the fifth transistor, a second terminal coupled to the second current source, and a control terminal coupled to the control terminal of the sixth transistor; and
an eighth transistor, having a first terminal coupled to the second terminal of the sixth transistor, a second terminal coupled to the second current source, and a control terminal coupled to the control terminal of the fifth transistor; and
a loading stage circuit, coupled to the first terminal of the first transistor and the first terminal of the second transistor, for generating an output signal at an output terminal of the operational amplifier circuit.

11. The operational amplifier circuit according to claim 10, wherein a size of the first transistor is substantially equal to a size of the second transistor, and a size of the third transistor is substantially equal to a size of the fourth transistor.

12. The operational amplifier circuit according to claim 10, wherein the differential input stage circuit further comprises:
- a first complementary current source;
- a first complementary transistor, having a first terminal, a second terminal, and a control terminal for receiving the first input signal;
- a second complementary transistor, having a first terminal, a second terminal, and a control terminal for receiving the second input signal;
- a third complementary transistor, having a first terminal coupled to the second terminal of the first complementary transistor, a second terminal coupled to the first complementary current source, and a control terminal coupled to the control terminal of the second complementary transistor; and
- a fourth complementary transistor, having a first terminal coupled to the second terminal of the second complementary transistor, a second terminal coupled to the first complementary current source, and a control terminal coupled to the control terminal of the first complementary transistor;
- wherein the loading stage circuit is coupled to the first terminal of the first complementary transistor and the first terminal of the second complementary transistor.

13. The operational amplifier circuit according to claim 12, wherein a size of the first complementary transistor is substantially equal to a size of the second complementary transistor, a size of the third complementary transistor is substantially equal to a size of the fourth complementary transistor.

14. The operational amplifier circuit according to claim 12, wherein the first transistor, the second transistor, the third transistor, and the fourth transistor are NMOS transistors, wherein the first complementary transistor, the second complementary transistor, the third complementary transistor, and the fourth complementary transistor are PMOS transistors.

15. The operational amplifier circuit according to claim 10, wherein the output terminal of the operational amplifier circuit is coupled to the control terminal of the second transistor and the control terminal of the sixth transistor.

16. The operational amplifier circuit according to claim 15, wherein the output signal is an interpolation result of the first input signal and the third input signal.

17. The operational amplifier circuit according to claim 10, wherein a size of the fifth transistor is substantially equal to a size of the sixth transistor, and a size of the seventh transistor is substantially equal to a size of the eighth transistor.

18. The operational amplifier circuit according to claim 10, wherein the output terminal of the operational amplifier circuit is coupled to an output stage circuit, and the output stage circuit is configured to provide a single-ended voltage signal for driving a display panel.

* * * * *